(12) United States Patent
Sarafianos et al.

(10) Patent No.: US 10,079,215 B2
(45) Date of Patent: *Sep. 18, 2018

(54) ELECTRONIC CHIP

(71) Applicant: STMicroelectronics (Rousset) SAS, Rousset (FR)

(72) Inventors: Alexandre Sarafianos, Pourrieres (FR); Mathieu Lisart, Aix en Provence (FR); Jimmy Fort, Puyloubier (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/789,362

(22) Filed: Oct. 20, 2017

(65) Prior Publication Data

US 2018/0040574 A1 Feb. 8, 2018

Related U.S. Application Data

(63) Continuation of application No. 15/348,735, filed on Nov. 10, 2016, now Pat. No. 9,837,364.

(30) Foreign Application Priority Data

Apr. 19, 2016 (FR) ..................... 16 53456

(51) Int. Cl.
*H01L 23/00* (2006.01)
*H01L 21/762* (2006.01)
*H01L 27/088* (2006.01)

(52) U.S. Cl.
CPC .......... *H01L 23/576* (2013.01); *H01L 21/762* (2013.01); *H01L 27/088* (2013.01)

(58) Field of Classification Search
CPC combination set(s) only.
See application file for complete search history.

(56) References Cited

U.S. PATENT DOCUMENTS

| | | |
|---|---|---|
| 5,585,651 A | 12/1996 | Kitagawa et al. |
| 6,323,518 B1 | 11/2001 | Sakamoto et al. |
| 8,809,858 B2 | 8/2014 | Lisart et al. |
| 9,754,902 B2 | 9/2017 | Lisart et al. |
| 2009/0071259 A1* | 3/2009 | Tanaka .................. G01L 9/0042 73/725 |
| 2012/0320477 A1 | 12/2012 | Lisart et al. |
| 2015/0014687 A1 | 1/2015 | Nakajima |
| 2015/0194393 A1 | 7/2015 | Lisart et al. |
| 2016/0218071 A1 | 7/2016 | Nam et al. |
| 2017/0116439 A1 | 4/2017 | Sarafianos et al. |

\* cited by examiner

*Primary Examiner* — Mamadou Diallo
(74) *Attorney, Agent, or Firm* — Seed IP Law Group LLP

(57) ABSTRACT

An electronic chip including: a plurality of first semiconductor bars of a first conductivity type and of second semiconductor bars of a second conductivity type arranged alternately and contiguously on a region of the first conductivity type; two detection contacts arranged at the ends of each second bar; a circuit for detecting the resistance between the detection contacts of each second bar; insulating trenches extending in the second bars down to a first depth between circuit elements; and insulating walls extending across the entire width of each second bar down to a second depth greater than the first depth.

21 Claims, 4 Drawing Sheets

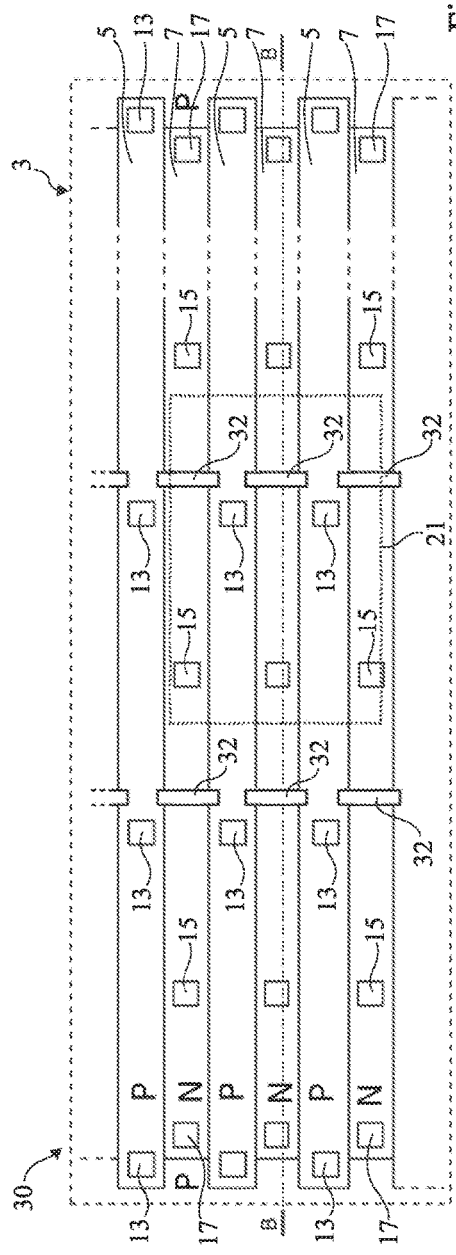
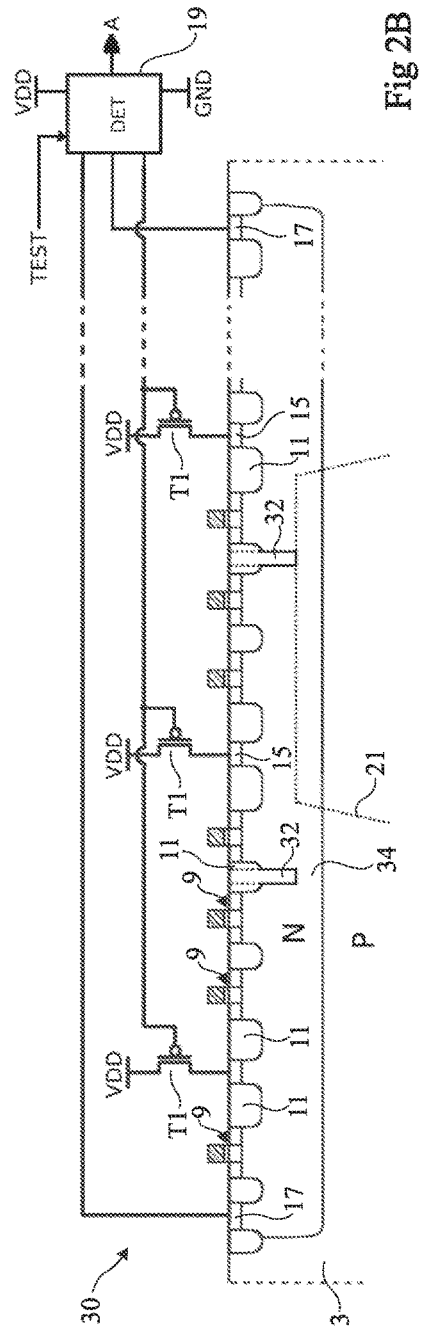

ELECTRONIC CHIP

BACKGROUND

Technical Field

The present disclosure relates to electronic chips, more particularly to an electronic chip protected against attacks carried out from the rear surface of the chip.

Description of the Related Art

Electronic chips containing confidential data, such as bank card chips, are likely to undergo attacks from pirates aiming at determining the operation of the chip and at extracting the confidential information therefrom.

BRIEF SUMMARY

Thus, an embodiment provides an electronic chip comprising: a plurality of first semiconductor bars of a first conductivity type and of second semiconductor bars of a second conductivity type arranged alternately and contiguously on a region of the first conductivity type; two detection contacts arranged at the ends of each second bar; a circuit for detecting the resistance between the detection contacts of each second bar; insulating trenches extending in the second bars down to a first depth between circuit elements; and insulating walls extending across the entire width of each second bar down to a second depth greater than the first depth.

According to an embodiment, the ratio of the second depth to the first depth is greater than 1.5.

According to an embodiment, the chip comprises on each of the second bars a plurality of bias contacts, each of which is connected by a switch to a bias potential source.

According to an embodiment, each insulating wall has a portion located in an insulating trench.

According to an embodiment, a doped region of the first conductivity type is located in the lower portion of each insulating wall.

According to an embodiment, the insulating walls have a width in the range from 50 to 150 nm.

According to an embodiment, each detection circuit is capable of comparing the electric resistance of two of the second bars and of generating an alert signal when the ratio of the electric resistances of the two second bars becomes greater than a threshold.

According to an embodiment, said threshold is in the range from 2 to 5.

According to an embodiment, each detection circuit is capable of applying a voltage on the detection contacts of said two second bars and of comparing an amplified value of a current flowing through one of the two second bars with a value of a current flowing through the other one of the two second bars.

According to an embodiment, said voltage is in the range from 300 to 600 mV.

The foregoing and other features and advantages will be discussed in detail in the following non-limiting description of specific embodiments in connection with the accompanying drawings.

BRIEF DESCRIPTION OF THE DRAWINGS

FIG. 2A is a partial simplified top view of an embodiment of an electronic chip;

FIG. 2B is a cross-section view of the embodiment shown in FIG. 2A and illustrates a detection circuit;

DETAILED DESCRIPTION

Figure 1A:
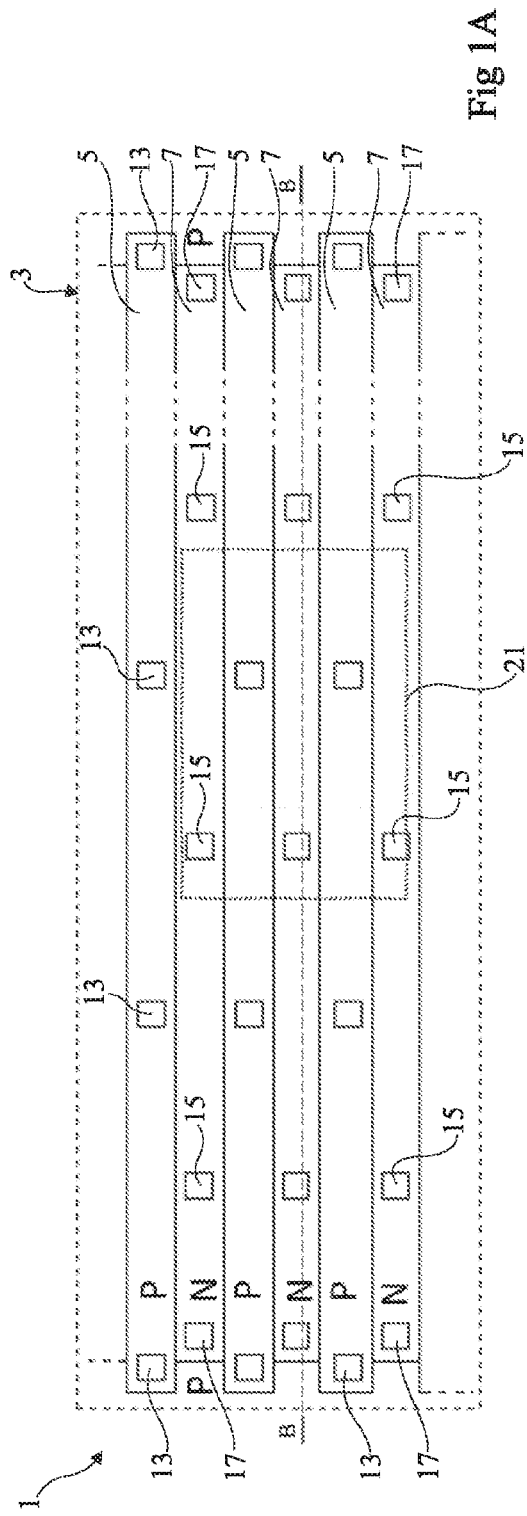
FIG. 1A is a partial simplified top view of an electronic chip.
Figure 1B:
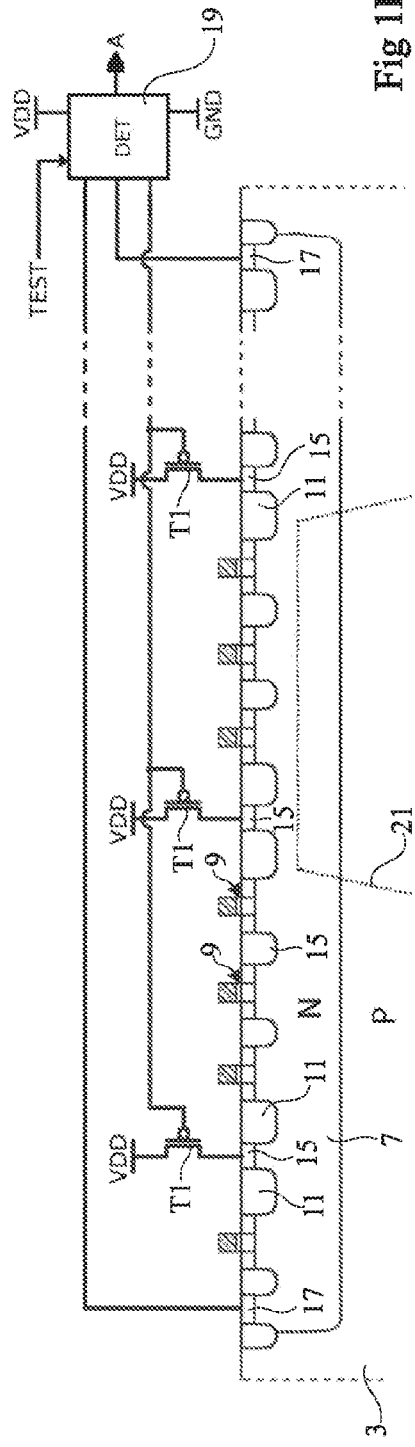
FIG. 1B is a cross-section view of an electronic chip and illustrates an attack detection circuit.

French patent application No. 15/59292 filed on Sep. 30, 2015, corresponding to U.S. patent application Ser. No. 15/072,209 filed Mar. 16, 2016 by the same applicant as the applicant of the present application, describes electronic chips protected against pirate attacks. FIGS. 1A and 1B illustrate the elements described in relation with FIGS. 3A and 3B of this patent application.

FIG. 1A is a partial simplified top view of an electronic chip 1. FIG. 1B is a cross-section view along plane B-B of FIG. 1A and further illustrates an attack detection circuit.

Chip 1 comprises, in the upper portion of a P-type doped semiconductor wafer 3, for example, made of silicon, alternated P-type doped wells 5 and N-type doped wells 7 with a pitch smaller than 5 µm. Each of wells 5 and 7 is bar-shaped. P wells 5 may be regions more heavily doped than semiconductor wafer 3 or may be portions of semiconductor wafer 3 delimited by N wells 7.

Elementary circuit components, that is, elements such as transistors, resistors, capacitors or components comprising P-N junctions, are formed inside and on top of P wells 5 and inside and on top of N wells 7. As an example, MOS transistors 9 are schematically shown in the cross-section view of FIG. 1B. The elementary components are formed in active areas surrounded with insulating trenches 11.

Each P well 5 is provided with bias contacts 13 connected to a ground GND. Each N well 7 is provided with bias contacts 15 connected via transistors T1 to a high potential source VDD.

Each N well 7 comprises on its upper surface a detection contact 17 at each of its ends. Detection contacts 17 of each N well 7 are connected to a detection circuit 19. Each detection circuit 19 is powered between potential VDD and ground GND. Each detection circuit 19 receives a test signal TEST and is capable of supplying an alert signal A.

During a test phase which may occur on starting of the chip, the test signals are successively activated by the chip. The detection circuit which receives a test signal blocks the associated transistors T1 and compares with a threshold value the electric resistance of the well between detection contacts 17. When there is no attack, each well has a resistance lower than the threshold value, and no alert signal is transmitted.

The case where, to carry out an attack, a pirate etches a cavity 21 from the lower surface of the chip, for example, with an ion beam, is here considered. Cavity 21 has lateral dimensions greater than 5 µm. The pirate intends to install in the cavity contacts with the components located at the upper surface, and to analyze the chip operation.

The presence of the cavity affects an N well 7, the resistance thereof increasing. Such a resistance increase is detected by the corresponding detection circuit 19 and an alert signal A is transmitted. At this signal, the chip destroys or hides the confidential data, or also stops its operation, and the pirate cannot carry on the attack.

Although such detection devices using well resistance measurements operate satisfactorily, it may be desired to improve the detection threshold and to simplify the detection circuit.

The same elements have been designated with the same reference numerals in the various drawings and, further, the various drawings are not to scale. For clarity, only those steps and elements which are useful to the understanding of the described embodiments have been shown and are detailed. In particular, elementary circuit components are not shown in top view.

In the following description, when reference is made to terms qualifying positions, such as terms "above", "under", "upper", "lower", etc., or to terms qualifying orientation, such as term "vertical", etc., reference is made to the orientation of the concerned element in the cross-section views.

In the present description, term "connected" designates a direct electric connection between two elements, while term "coupled" designates an electric connection between two elements which may be direct or via one or a plurality of passive or active components, such as resistors, capacitors, inductances, diodes, transistors, etc.

The attack by a pirate of a chip of the type of chip 1 of FIGS. 1A and 1B has been analyzed. When the pirate etches an attack cavity, the resistance of the damaged well only rises above the resistance threshold when the cavity comes close to the insulating trenches, or even when it reaches the trenches. Now, N wells 7 of chip 1 may have a depth in the range from 1 to 2 µm and insulating trenches 11 extend from the upper surface down to a depth for example smaller than 0.5 µm. A pirate could, by successive trials, etch a cavity which extends through a large part of the well depth and which stops at a sufficient distance from the bottom of the trenches for the attack not to be detected. There then is a risk for the pirate to be still able to obtain by this cavity the information that he/she covets. The detection circuit should be provided to avoid this risk, in particular by an accurate adjustment of the threshold resistance, which poses practical implementation problems.

An electronic chip having a protection level greater than that of the chip of FIGS. 1A and 1B is thus desired to be obtained.

FIG. 2A is a partial simplified top view of an embodiment of an electronic chip 30 protected against attacks. FIG. 2B is a cross-section view along plane B-B of FIG. 2A and further illustrates an attack detection circuit.

Chip 30 comprises the elements of chip 1 illustrated in FIGS. 1A and 1B, that is:
  an alternation of bar-shaped P-type doped wells 5 and N-type doped wells 7 arranged in the upper portion of a semiconductor trench 3;
  insulating trenches 11 separating circuit elements such as transistors 9;
  bias contacts 13 and 15 located on respective wells 5 and 7, contacts 15 being connected by transistors T1 to a potential source VDD;
  detection contacts 17 at the ends of N wells 7; and
  for each N well 7, a detection circuit 19 capable of generating an alert signal A when the resistance of the well between detection contacts 17 becomes greater than a threshold resistance.

Chip 30 further comprises insulating walls 32 which extend transversely in N wells 7 from the upper surface of the well down to a depth greater than the trench depth. As an example, the depth of the insulating walls is greater than 1.5 times the trench depth. The depth of the insulating walls may be in the order of 0.6 µm, for example, in the range from 0.5 to 0.7 µm. Portions 34 of N wells 7 are located under the insulating walls. Each of insulating walls 32 extends in a direction orthogonal to the bar direction across the entire width of the bars.

The operation of chip 30 is similar to that of chip 1 described in relation with FIGS. 1A and 1B. Indeed, portions 34 of an N well 7 provide the electric continuity of the well between detection contacts 17. In the absence of an attack by digging of the rear surface, all N wells 7 have a same resistance value, called normal value.

On digging of a cavity 21 by a pirate, as soon as the cavity reaches a portion 34 of an N well 7 located under an insulating wall 32, the electric resistance of N well 7 increases. This resistance becomes infinite as soon as cavity 21 reaches the bottom of insulating wall 32.

In order for its attack not to be detected, the pirate should stop etching the cavity before reaching the bottom of the insulating walls, that is, far from the bottom of the trenches. A large portion of the N well then remains between the elementary components and the cavity. Thereby, the pirate no longer has the possibility of identifying the contributions of the various individual components arranged opposite the cavity.

Thus, the presence of insulating walls deeper than the trenches enables to particularly precociously counter the attack, thus providing a particularly high level of protection against pirate attacks.

Such a particularly high protection level is ensured for the circuit elements arranged between two neighboring insulating walls of a same N well 7 when the distance between neighboring walls is smaller than the lateral dimension of cavity 21. As an example, the neighboring insulating walls are separated by a distance smaller than 5 µm. As an example, insulating walls 32 may be distributed along each N well 7 or may be provided only in well portions comprising circuit elements which are particularly desired to be protected.

As an example, the insulating walls may extend along a length greater than the bar width, and may extend through a plurality of P and N wells 5 and 7.

Figure 3:
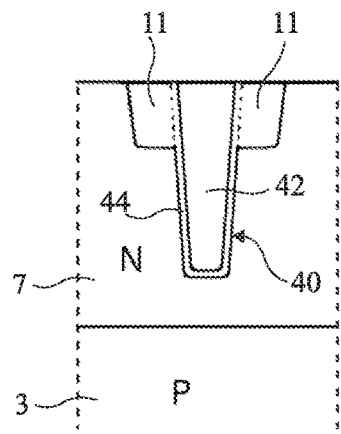
FIG. 3 is a partial simplified cross-section view illustrating an example of an insulating wall.

FIG. 3 is a partial simplified cross-section view at a scale different from that of FIGS. 2A and 2B, and illustrates an example of insulating wall 40 in an N well 7. Insulating wall 40 extends through an insulating trench 11. Insulating wall 40 comprises a conductive wall 42, for example, made of polysilicon insulated from N well 7 by insulating walls 44, for example, made of silicon oxide.

Due to the position of the insulating wall in an insulating trench 11, the insulating wall does not occupy space usable for the circuits. Thereby, a particularly high level of protection against pirate attacks may be obtained without increasing the chip surface area.

Further, the provision of insulating walls 40 generally adds no manufacturing step, structures similar to such insulating walls being often provided for other purposes in an electronic chip.

As an example, the width of the walls is in the range from 50 to 150 nm. As an example, the thickness of the silicon oxide wall of insulating walls 40 is in the range from 5 nm to 20 nm.

Figure 4:
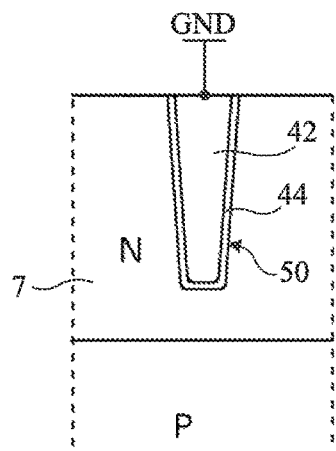
FIG. 4 is a partial simplified cross-section view illustrating another example of an insulating wall.

FIG. 4 is a partial simplified cross-section view illustrating another example of insulating wall 50 located in an N well 7. Insulating wall 50 comprises a conductive wall 42 insulated from N well 7 by a wall 44. The conductive wall is for example connected to ground GND.

Insulating wall 50 then forms a capacitive element between ground and N well 7. In addition to the protection against attacks, the presence of such a capacitive element improves the chip operation by stabilizing the potential of N well 7.

Figure 5:
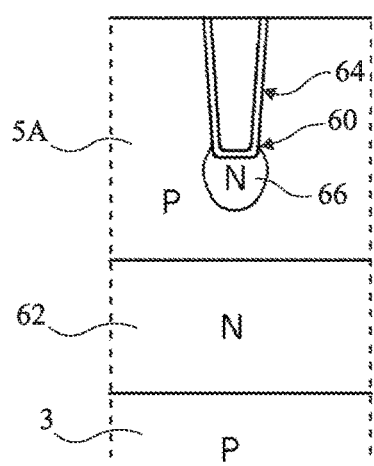
FIG. 5 is a partial simplified cross-section view illustrating another example of an insulating wall.

FIG. 5 is a partial simplified cross-section view illustrating an embodiment of another embodiment of an insulating wall 60.

The structure of FIG. 5 is obtained by a method comprising a step of N-type doping of an upper portion of a semiconductor wafer 3 to form a region 62, followed by a step of forming a structure 64 similar to that of insulating wall 50 of FIG. 4, followed by a step of forming P-type doped wells 5A in the form of bars. P wells 5A are fitted at their ends with detection contacts (not shown) and their resistances are measured by attack detection circuits.

The obtained insulating wall 60 comprises an N-type doped area 66 located under structure 64 and in contact therewith. Doped area 66 extends across the width of well 5A and is in contact with two N-type doped wells (not shown in the cross-section plane) arranged on either side of P well 5A.

In operation, area 66 is taken to the high potential level applied to the N wells. No current can flow through area 66 between the portions of P well 5A located on either side of area 66.

Figure 6:
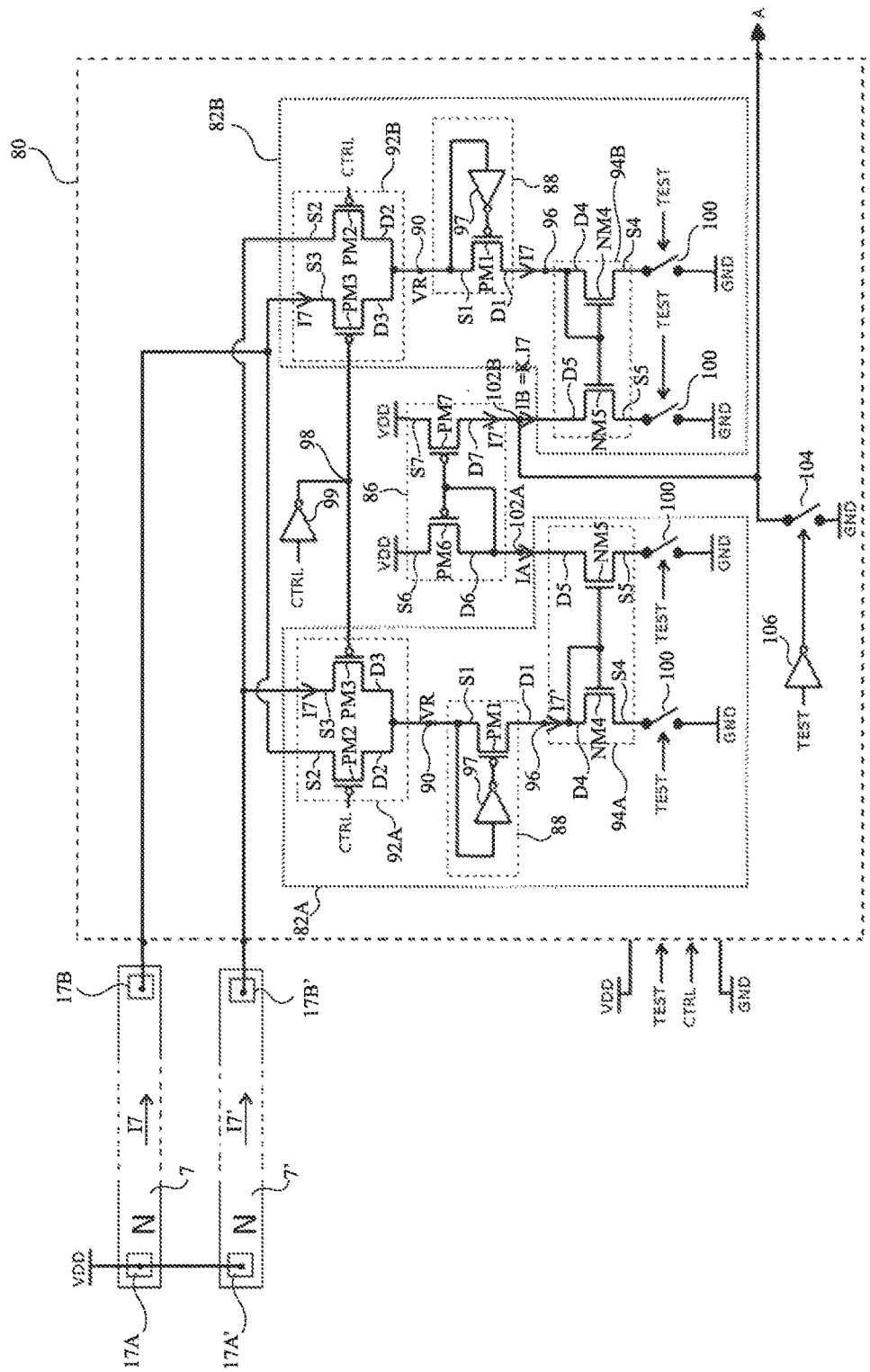
FIG. 6 shows an example of a detection circuit connected to two wells.

FIG. 6 shows, as an example only, an embodiment of a detection circuit 80 connected to two similar N-type doped wells 7 and 7'. Each well 7, 7' is shown in simplified top view. Well 7 is provided with detection contacts 17A and 17B and well 7' is provided with detection contacts 17A' and 17B'. Contacts 17A and 17A' are connected together to potential source VDD. Detection circuit 80, powered between potentials VDD and ground GND, can receive a test signal TEST and a control signal CTRL, and can generate an alert signal A.

Detection circuit 80 comprises two resistance measurement circuits 82A and 82B, each intended to apply a regulated potential difference VDD-VR between the detection contacts of bars 7 and 7' and of supplying currents IA and IB which are images of the currents then flowing through the bars. A current mirror 86 is provided to compare currents IA and IB to supply the alert signal.

Each measurement circuit 82A and 82B comprises:
- a voltage regulator 88 intended to regulate the potential VR of a node 90;
- a switch 92A, 92B intended to apply the potential of node 90 according to the control signal CTRL received by detection circuit 80; and
- a current mirror 94A, 94B capable of supplying current IA, IB from the current originating from a bar and which flows through voltage regulator 88.

Each voltage regulator 88 comprises a P-channel MOS-type transistor PM1 having its source S1 coupled to node 90 and its drain D1 coupled to a node 96. The gate of transistor PM1 is coupled to the output of an inverter 97 having its input coupled to node 90. The regulated potential VR is equal to the threshold potential of inverter 97.

Each switch 92A, 92B comprises two P-channel MOS-type transistors PM2 and PM3 having their drains D2 and D3 connected to node 90. Transistor PM2 is controlled by signal CTRL. The gate of transistor PM3 is coupled to output node 98 of an inverter 99 receiving signal CTRL.

Source S2 of transistor PM2 of circuit 92A and source S3 of transistor PM3 of circuit 92B are connected to detection contact 17B. Source S2 of circuit 92B and source S3 of circuit 92A are connected to detection contact 17B'.

Each current mirror 94A, 94B comprises N-type MOS transistors NM4 and NM5 having their gates coupled to node 96. Sources S4 and S5 of transistors NM4 and NM5 are coupled to ground GND by switches 100. Transistor NM4 has its drain D4 coupled to node 96. Drain D5 of transistor NM5 is connected to an output node 102A, 102B of measurement circuit 82A, 82B.

Current mirror 86 has an input branch connected to output 102A of circuit 82A and an output branch connected to output 102B of circuit 82B. Current mirror 96 comprises P-channel MOS-type transistors PM6 and PM7 having their gates coupled to node 102A and sources S6 and S7 are coupled to potential source VDD. Drain D6 of transistor PM6 is coupled to node 102A and drain D7 of transistor PM7 is coupled to node 102B.

Node 102B is further coupled to ground by a switch 104 controlled by the output of an inverter 106 receiving signal TEST. Alert signal A corresponds to the potential level of node 102B.

During the test phase, while test signal TEST is activated, control signal CTRL is successively taken to a high level and then to a low level.

When control signal CTRL is at the high level, measurement circuit 82A applies potential VR to detection contact 17B'. A current I7' flows through bar 7' and through the input branch of mirror 94A. Series-connected current mirrors 94A and 86 are provided to then inject into node 102B a current having an intensity equal to that of current I7'. Further, measurement circuit 82B applies potential VR on detection contact 17B. A current I7 flows through bar 7 and through the input branch of mirror 94B. Current mirror 94B is provided to amplify current I7 by a factor K, and to absorb amplified current K*I7 from node 102B.

In case of an attack, when the ratio of the resistance of well 7 to that of well 7' is greater than amplification factor K, current I7' injected into node 102B has an intensity greater than that of current K*I7 absorbed from node 102B. The potential of node 102B increases and saturates at a high level. Thus, alert signal A is transmitted.

When there is no attack, the resistances are equal and currents I7 and I7' are equal. The potential of node 102B decreases and saturates at a low level.

When test signal TEST is active and signal CTRL is at the low level, the operation is similar to that described hereabove, the roles of detection contacts 17B and 17B' of wells 7 and 7' having been inverted by the switches. Alert signal A is transmitted when the ratio of the resistance of well 7' to that of well 7 is greater than amplification factor K.

The detection circuit thus enables to successively detect during the test phase an attack on one or the other of wells 7 and 7'.

In the absence of test signal TEST, switch 104 is conductive and no alert signal is transmitted.

As an example, amplification factor K is in the range from 2 to 5. As an example, threshold voltage VR of inverters 97 is in the range from 300 mV to 600 mV.

Specific embodiments have been described. Various alterations, modifications, and improvements will occur to those skilled in the art. In particular, although bias contacts 15 are coupled to potential source VDD by MOS-type transistors, bias contacts 15 may be coupled to potential source VDD by switches of any other adapted type, for example, bipolar transistors.

Further, other possible embodiments correspond to the embodiments described hereabove where the N and P conductivity types are exchanged, the channel types of the MOS transistors being then exchanged, and the low GND and high VDD potential values being exchanged.

Although a specific embodiment of a detection circuit has been described, any well resistance detection circuit may be used, in particular any detection circuit of a type mentioned in the previously-described patent application.

Such alterations, modifications, and improvements are intended to be part of this disclosure, and are intended to be within the spirit and the scope of the present disclosure. Accordingly, the foregoing description is by way of example only and is not intended to be limiting. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electronic chip, comprising:
    a semiconductor region;
    a first semiconductor bar arranged on the semiconductor region;
    a detection circuit configured to detect a resistance of the first semiconductor bar;
    an insulating trench extending in the first semiconductor bar down to a first depth and defining active areas of the electronic chip; and
    insulating walls each extending in the first semiconductor bar and down to a second depth greater than the first depth.

2. The electronic chip of claim 1, wherein a ratio of the second depth to the first depth is greater than 1.5.

3. The electronic chip of claim 1, comprising:
    one or more switches; and
    a plurality of bias contacts on the first semiconductor bar, the first semiconductor bar being electrically coupled by the one or more switches to a bias potential terminal.

4. The electronic chip of claim 1, wherein each insulating wall has a portion located in the insulating trench.

5. The electronic chip of claim 1, wherein the first semiconductor bar is of a first conductivity type, the electronic chip further comprising a plurality of doped regions of a second conductivity type located in the first semiconductor bar, each insulating wall having a lower portion contacting a corresponding one of the doped regions.

6. The electronic chip of claim 5, further comprising a plurality of conductive walls positioned in the insulating walls, respectively, each conductive wall being electrically coupled to a ground terminal.

7. The electronic chip of claim 1, wherein the insulating walls each have a width in a range from 50 to 150 nm.

8. The electronic chip of claim 1, wherein the first semiconductor bar is of a first conductivity type, the electronic chip further comprising:
    a second semiconductor bar of the first conductivity type arranged on the semiconductor region; and
    a third semiconductor bar of a second conductivity type arranged on the semiconductor region and positioned between the first and second semiconductor bards, wherein the detection circuit is configured to compare electric resistances of the first and second semiconductor bars and generate an alert signal when a ratio of the electric resistances of the first and second semiconductor bars becomes greater than a threshold.

9. The electronic chip of claim 8, wherein said threshold is in a range from 2 to 5.

10. The electronic chip of claim 1, wherein the first semiconductor bar is of a first conductivity type and has ends, the electronic chip further comprising a first pair of detection contacts, the detection contacts of the first pair being arranged at the ends of the first semiconductor bar, wherein:
    the detection circuit is configured to detect the resistance of the first semiconductor bar by detecting a resistance between the detection contacts; and
    the insulating walls each extend across an entire width of the first semiconductor bar.

11. The electronic chip of claim 10, further comprising:
    a second pair of detection contacts, the detection contacts of the second pair being arranged at ends of the second semiconductor bar, wherein the detection circuit is configured to apply a voltage on the detection contacts of said first and second semiconductor bars and compare an amplified value of a current flowing through one of the first and second semiconductor bars with a value of a current flowing through the other one of the first and second semiconductor bars.

12. The electronic chip of claim 11, wherein said voltage is in the range from 300 to 600 mV.

13. An electronic chip, comprising:
    a first semiconductor bar of a first conductivity type;
    first and second semiconductor regions of a second conductivity type positioned on opposite sides of the first semiconductor bar;
    first and second detection contacts contacting the first semiconductor bar;
    a detection circuit configured to detect a first resistance between the first and second detection contacts;
    insulating trenches extending in the first semiconductor bar down to a first depth and defining respective active areas of the electronic chip; and
    insulating walls each extending across an entire width of the first semiconductor bar and down to a second depth greater than the first depth, the insulating walls extending from the first semiconductor region to the second semiconductor region.

14. The electronic chip of claim 13, comprising:
    one or more switches; and
    a plurality of bias contacts on the first semiconductor bar, the first semiconductor bar being electrically coupled by the one or more switches to a bias potential terminal.

15. The electronic chip of claim 13, wherein each insulating wall has a portion located in a corresponding one of the insulating trenches.

16. The electronic chip of claim 13, further comprising a plurality of doped regions of the second conductivity type located in the first semiconductor bar, each insulating wall having a lower portion contacting a corresponding one of the doped regions.

17. The electronic chip of claim 16, further comprising a plurality of conductive walls positioned in the insulating walls, respectively, each conductive wall being electrically coupled to a ground terminal.

18. The electronic chip of claim 13, further comprising:
    a second semiconductor bar of the first conductivity type, the first semiconductor region extending between the first and second semiconductor bars;
    third and fourth detection contacts contacting the second semiconductor bar, wherein the detection circuit is configured to detect a second resistance between the third and fourth detection contacts, compare the first and second resistances, and generate an alert signal when a ratio of the first and second resistances becomes greater than a threshold.

19. A system, comprising:

first and second semiconductor bars of the first conductivity type spaced apart from each other;

a semiconductor region of a second conductivity type positioned between the first and second semiconductor bars;

first and second detection contacts contacting the first semiconductor bar;

a detection circuit configured to detect a first resistance between the first and second detection contacts;

insulating trenches extending in the first semiconductor bar down to a first depth and defining respective active areas of the electronic chip;

first insulating walls each extending across an entire width of the first semiconductor bar and down to a second depth greater than the first depth; and second insulating walls each extending across an entire width of the second semiconductor bar and down to the second depth, the first insulating walls being spaced apart from the second insulating walls by the semiconductor region that is positioned between the first and second semiconductor bars.

20. The electronic chip of claim 19, comprising:

one or more switches; and a plurality of bias contacts on the first semiconductor bar, the bias contacts being electrically coupled by the one or more switches to a bias potential terminal.

21. The electronic chip of claim 19, further comprising:

third and fourth detection contacts contacting the second semiconductor bar, wherein the detection circuit is configured to detect a second resistance between the third and fourth detection contacts, compare the first and second resistances, and generate an alert signal when a ratio of the first and second resistances becomes greater than a threshold.

\* \* \* \* \*